US011333985B2

(12) United States Patent
Goorden et al.

(10) Patent No.: US 11,333,985 B2
(45) Date of Patent: May 17, 2022

(54) POSITION SENSOR

(71) Applicant: ASML Netherlands B.V., Veldhoven (NL)

(72) Inventors: Sebastianus Adrianus Goorden, Eindhoven (NL); Simon Reinald Huisman, Eindhoven (NL); Duygu Akbulut, Eindhoven (NL); Alessandro Polo, Arendonk (BE); Johannes Antonius Gerardus Akkermans, Waalre (NL); Arie Jeffrey Den Boef, Waalre (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 17/254,601

(22) PCT Filed: Jun. 5, 2019

(86) PCT No.: PCT/EP2019/064661
§ 371 (c)(1),
(2) Date: Dec. 21, 2020

(87) PCT Pub. No.: WO2020/007558
PCT Pub. Date: Jan. 9, 2020

(65) Prior Publication Data
US 2021/0124276 A1 Apr. 29, 2021

(30) Foreign Application Priority Data
Jul. 6, 2018 (EP) .................................... 18182091

(51) Int. Cl.
*G03F 9/00* (2006.01)

(52) U.S. Cl.
CPC .......... *G03F 9/7046* (2013.01); *G03F 9/7049* (2013.01); *G03F 9/7065* (2013.01); *G03F 9/7088* (2013.01); *G03F 9/7092* (2013.01)

(58) Field of Classification Search
CPC .... G03F 9/7046; G03F 9/7049; G03F 9/7065; G03F 9/7088; G03F 9/7092
See application file for complete search history.

(56) References Cited

U.S. PATENT DOCUMENTS 6,952,253 B2    10/2005   Lof et al.
6,961,116 B2    11/2005   Den Boef et al.
(Continued)

FOREIGN PATENT DOCUMENTS

JP    2016519765 A    7/2016
WO   2018041440 A1   3/2018
(Continued)

OTHER PUBLICATIONS

Wiebo van Toledo, European Patent Office International Searching Authority, International Search Report and Written Opinion, corresponding PCT Application No. PCT/EP2019/064661, dated Oct. 11, 2019, 12 pages total.
(Continued)

*Primary Examiner* — Peter B Kim
(74) *Attorney, Agent, or Firm* — DiBierardino McGovern IP Group LLC

(57) ABSTRACT

The invention provides a position sensor (300) which comprises an optical system (305,306) configured to provide measurement radiation (304) to a substrate (307). The optical system is arranged to receive at least a portion of radiation (309) diffracted by a mark (308) provided on the substrate. A processor (313) is applied to derive at least one position-sensitive signal (312) from the received radiation. The measurement radiation comprises at least a first and a
(Continued)

second selected radiation wavelength. The selection of the at least first and second radiation wavelengths is based on a position error swing-curve model.

22 Claims, 6 Drawing Sheets

(56) References Cited

U.S. PATENT DOCUMENTS

| | | | |
|---|---|---|---|
| 2005/0051742 A1 | 3/2005 | Shiraishi | |
| 2012/0133938 A1* | 5/2012 | Deckers | G03F 9/7088 356/388 |
| 2015/0261097 A1 | 9/2015 | Mathijssen et al. | |
| 2015/0346605 A1* | 12/2015 | Den Boef | G03F 9/708 438/401 |
| 2015/0355554 A1 | 12/2015 | Mathijssen | |
| 2018/0017881 A1 | 1/2018 | Van Der Schaar et al. | |
| 2018/0299790 A1* | 10/2018 | Shome | G03F 9/7069 |

FOREIGN PATENT DOCUMENTS

| | | |
|---|---|---|
| WO | 2018160779 A1 | 9/2018 |
| WO | 2018188891 A1 | 10/2018 |
| WO | 2019166190 A1 | 9/2019 |

OTHER PUBLICATIONS

K. Bhattacharyya et al., "A study of swing-curve physics in diffraction-based overlay," Metrology, Inspection, and Process Control for Microlithography XXX, Proc. of SPIE, vol. 9778 (Mar. 24, 2016), doi: 10.1117/12.2222040.

Office Action by Examiner Akira Imai of the Japan Patent Office, counterpart Japanese Patent Application No. 2020-568522, dated Nov. 24, 2021, 13 pages total (including English translation of 7 pages).

* cited by examiner

POSITION SENSOR

CROSS-REFERENCE TO RELATED APPLICATIONS

This application claims priority of EP application 18182091.1 which was filed on 6 Jul. 2018 and which is incorporated herein in its entirety by reference.

FIELD

The present invention relates to position measurements systems and metrology systems, and specifically to position sensors.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern (also often referred to as "design layout" or "design") of a patterning device (e.g., a mask) onto a layer of radiation-sensitive material (resist) provided on a substrate (e.g., a wafer).

As semiconductor manufacturing processes continue to advance, the dimensions of circuit elements have continually been reduced while the amount of functional elements, such as transistors, per device has been steadily increasing over decades, following a trend commonly referred to as 'Moore's law'. To keep up with Moore's law the semiconductor industry is chasing technologies that enable to create increasingly smaller features. To project a pattern on a substrate a lithographic apparatus may use electromagnetic radiation. The wavelength of this radiation determines the minimum size of features which are patterned on the substrate. Typical wavelengths currently in use are 365 nm (i-line), 248 nm, 193 nm and 13.5 nm. A lithographic apparatus, which uses extreme ultraviolet (EUV) radiation, having a wavelength within a range of 4 nm to 20 nm, for example 6.7 nm or 13.5 nm, may be used to form smaller features on a substrate than a lithographic apparatus which uses, for example, radiation with a wavelength of 193 nm.

There is a continuing trend of utilizing material layers in the manufacturing process that are not transparent for visible light, for example metal or carbon layers or chalcogenide-based materials for 3D memory applications. Using these types of opaque materials in the manufacturing process results in the challenge of detecting marks that are typically used for wafer alignment, or for metrology purposes in general, when overlaid by such an opaque material layer. Conventional metrology tools that utilize visible light for detecting such marks are not able to measure the marks anymore, since these marks are obscured by the overlaying opaque material layer.

The wavelength range of a metrology tool can be extended to the infrared wavelength region to measure underneath material layers that are opaque for visible light, but at least partially transparent for infrared light. An example of an alignment sensor, which operates in the infrared spectrum, is disclosed in EP16186333A1. A drawback of using infrared light is the scattering of the infrared light by the substrate surface roughness or by the surface topography, which may be induced by the buried marks, that may interfere with infrared light diffracted from the buried mark. This means that the diffracted infrared light, which comprises spatial information of the mark, is interlaced with infrared light scattered by the substrate surface. This may result in an unacceptable error in the determination of the mark position.

SUMMARY

It is an object of the invention to provide a position sensor that is less sensitive to substrate topography induced errors. In view of the above, the invention provides a position sensor comprising an optical system configured to provide measurement radiation to a substrate and to receive at least part of diffracted radiation after the measurement radiation has interacted with a mark provided on the substrate, wherein the measurement radiation comprises at least two selected radiation wavelengths, at least one optical detector configured to detect the at least part of diffracted radiation and arranged to convert the detected at least part of diffracted radiation to an electronic signal, a processor configured to derive at least one position-sensitive signal from the electronic signal, and a radiation wavelength selection system having access to at least one of a first subsystem and a second subsystem; the first subsystem configured to receive material stack information and to calculate a position error swing-curve model, the second subsystem configured to select the at least two selected radiation wavelengths based on the position error swing-curve model.

The inventors of the present invention have recognized that the error in a position value fluctuates as a function of the wavelength of the measurement radiation that is used to measure the position of a buried mark. Moreover, the position error as a function of wavelength shows a swing-curve behaviour around zero.

Per radiation wavelength, position information may be obtained each with a position error according to the swing-curve model. With a spectral pair, formed by two selected radiation wavelengths, the position information of the mark is calculated by a weighted sum of a first position-sensitive signal derived from the radiation of the first radiation wavelength with the position-sensitive signal derived from the radiation of the second radiation wavelength.

Selecting at least two wavelengths based on the swing-curve model, for example, an spectral pair of two wavelength ranges corresponding to position errors with different polarity, the position errors cancel each other. In general, the summed position error corresponding to the selected radiation wavelengths becomes approximately equal to zero: $\Sigma_i^n p_i \approx 0$, where $p_i$ is the position error at radiation wavelength $\lambda_i$, i an integer, and n the number of wavelengths.

The at least two selected wavelengths may differ by $(2m+1)\Omega/2$, where m is an integer equal to or greater than 0 and $\Omega$ a swing-curve period. By this selection criterium, the first and second radiation wavelengths differ by an odd number of half a swing-curve period and the corresponding position errors have different polarity.

The inventors have recognized that the error in a position value may be compensated or balanced by using measurement radiation with selected radiation wavelengths comprising an odd number of wavelengths. The odd number of wavelengths may be equally distributed over a single swing-curve period $\Omega$. Herewith, the equally distributed wavelengths differ by the swing-curve period divided by the odd number of radiation wavelengths. This limits the required radiation wavelength range of the measurement radiation, which may be beneficial for the position sensor design. In general, the measurement radiation may comprise n wavelengths and the n radiation wavelengths differ by Ω/n, where n is an odd integer greater than 1, and Ω the swing-curve period.

According to an embodiment of the invention, the optical system comprises an optical transmission filter with a suppression spectrum according to an envelope of the swing curve. The optical transmission filter is arranged such that the received radiation passes through the optical transmission filter. The amplitude of the transmitted radiation is reduced according to the envelope of the swing-curve. Herewith, a gauge transfer, or normalisation, of the amplitude is obtained, which compensates the difference in position errors at the different wavelengths of the received measurement radiation, before the transmitted radiation interacts with the optical detector.

According to an embodiment of the invention, the measurement radiation is provided by a radiation source comprising one or more light sources are arranged to generate radiation of the at least two selected radiation wavelengths. The first and second radiation wavelength may be within the infrared spectrum, and more specifically, in the near-infrared and or mid-infrared spectrum. Measurement radiation, with the first and second radiation wavelength within the infrared spectrum, is capable to penetrate through a material layers that are opaque for radiation within the visible spectrum and may interact with a mark buried by such a material layer.

The position sensor is provided with a radiation source, comprising at least a dual-band wavelength selector, such that the mark can be measured by using radiation with the first and the second radiation wavelength.

According to an embodiment of the invention, the radiation source is capable to operate in a pulsed mode, herewith providing the measurement radiation having temporally separated the at least first and second radiation wavelengths. This allows more wavelengths to be used during a single position measurement.

According to an embodiment of the invention, the position sensor may comprise a time-gated optical detector synchronized to the radiation source operating in the pulsed mode.

According to an embodiment of the invention, optical system comprises at least one interferometer.

According to an embodiment of the invention, there is provided a lithographic apparatus for use in applying a pattern to a substrate, the lithographic apparatus comprises at least one position sensor as set forth herein and a controller configured for causing the position sensor to acquire the position information of one or more marks provided on the substrate using radiation in two or more selected radiation wavelength ranges, and for using the measured position of one or more marks to control the positioning of one or more patterns applied to the substrate. The at least one position sensor may therefore be arranged as an alignment sensor, that enables alignment through opaque material layers. Information of the mark positions may be used to calculate a wafer grid before exposing a successive material layer.

The invention further provides a metrology apparatus that comprises at least one position sensor as set forth herein and a controller configured for causing the at least one position sensor to acquire the position information of one or more marks using radiation in two or more selected radiation wavelength ranges. The at least one position sensor may therefore be arranged as a metrology sensor that enables the position measurement of one or more metrology marks that are buried by material layers that are opaque for radiation within the visible spectrum, in order to obtain overlay information of the layers.

In an embodiment, a system comprises a lithographic apparatus and a metrology apparatus. The system includes at least one position sensor according to the invention. Herewith, either the lithographic apparatus or the metrology apparatus or both are capable of acquiring position information of one or more marks that are buried by material layers.

According to an aspect of the invention there is provided a method for obtaining position information of a mark provided on an object, the method comprising the steps of: selecting at least a first radiation wavelength and a second radiation wavelength, irradiating the object with measurement radiation of at least the first and second radiation wavelength, receiving at least a portion of the radiation diffracted and/or scattered from the object, generating a position measurement signal from a detector output signal, deriving characteristics of the mark from the position measurement signal, whereby the selection of the at least first and second radiation wavelengths is based on a position error swing-curve model.

BRIEF DESCRIPTION OF THE DRAWINGS

Embodiments of the invention will now be described, by way of example only, with reference to the accompanying schematic drawings, in which.

DETAILED DESCRIPTION

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range of about 5-100 nm).

The term "reticle", "mask" or "patterning device" as employed in this text may be broadly interpreted as referring to a generic patterning device that can be used to endow an incoming radiation beam with a patterned cross-section, corresponding to a pattern that is to be created in a target portion of the substrate. The term "light valve" can also be used in this context. Besides the classic mask (transmissive or reflective, binary, phase-shifting, hybrid, etc.), examples of other such patterning devices include a programmable mirror array and a programmable LCD array.

Figure 1:
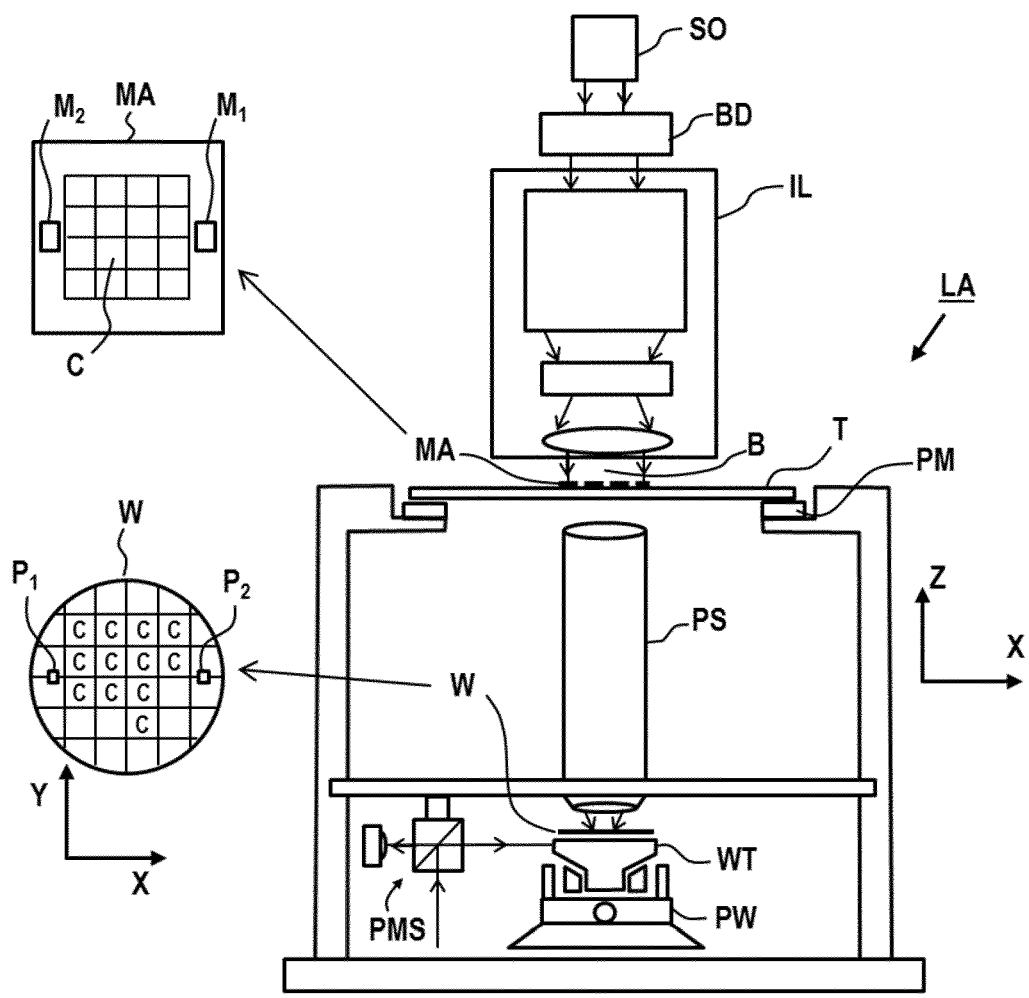
FIG. 1 depicts a schematic overview of a lithographic apparatus.

FIG. 1 schematically depicts a lithographic apparatus LA. The lithographic apparatus LA includes an illumination system (also referred to as illuminator) IL configured to condition a radiation beam B (e.g., UV radiation, DUV radiation or EUV radiation), a mask support (e.g., a mask table) MT constructed to support a patterning device (e.g., a mask) MA and connected to a first positioner PM configured to accurately position the patterning device MA in accordance with certain parameters, a substrate support (e.g., a wafer table) WT constructed to hold a substrate (e.g., a resist coated wafer) W and connected to a second positioner PW configured to accurately position the substrate support in accordance with certain parameters, and a projection system (e.g., a refractive projection lens system) PS configured to project a pattern imparted to the radiation beam B by patterning device MA onto a target portion C (e.g., comprising one or more dies) of the substrate W.

In operation, the illumination system IL receives a radiation beam from a radiation source SO, e.g. via a beam delivery system BD. The illumination system IL may include various types of optical components, such as refractive, reflective, magnetic, electromagnetic, electrostatic, and/or other types of optical components, or any combination thereof, for directing, shaping, and/or controlling radiation. The illuminator IL may be used to condition the radiation beam B to have a desired spatial and angular intensity distribution in its cross section at a plane of the patterning device MA.

The term "projection system" PS used herein should be broadly interpreted as encompassing various types of projection system, including refractive, reflective, catadioptric, anamorphic, magnetic, electromagnetic and/or electrostatic optical systems, or any combination thereof, as appropriate for the exposure radiation being used, and/or for other factors such as the use of an immersion liquid or the use of a vacuum. Any use of the term "projection lens" herein may be considered as synonymous with the more general term "projection system" PS.

The lithographic apparatus LA may be of a type wherein at least a portion of the substrate may be covered by a liquid having a relatively high refractive index, e.g., water, so as to fill a space between the projection system PS and the substrate W—which is also referred to as immersion lithography. More information on immersion techniques is given in U.S. Pat. No. 6,952,253, which is incorporated herein by reference.

The lithographic apparatus LA may also be of a type having two or more substrate supports WT (also named "dual stage"). In such "multiple stage" machine, the substrate supports WT may be used in parallel, and/or steps in preparation of a subsequent exposure of the substrate W may be carried out on the substrate W located on one of the substrate support WT while another substrate W on the other substrate support WT is being used for exposing a pattern on the other substrate W.

In addition to the substrate support WT, the lithographic apparatus LA may comprise a measurement stage. The measurement stage is arranged to hold a sensor and/or a cleaning device. The sensor may be arranged to measure a property of the projection system PS or a property of the radiation beam B. The measurement stage may hold multiple sensors. The cleaning device may be arranged to clean part of the lithographic apparatus, for example a part of the projection system PS or a part of a system that provides the immersion liquid. The measurement stage may move beneath the projection system PS when the substrate support WT is away from the projection system PS.

In operation, the radiation beam B is incident on the patterning device, e.g. mask, MA which is held on the mask support MT, and is patterned by the pattern (design layout) present on patterning device MA. Having traversed the mask MA, the radiation beam B passes through the projection system PS, which focuses the beam onto a target portion C of the substrate W. With the aid of the second positioner PW and a position measurement system IF, the substrate support WT can be moved accurately, e.g., so as to position different target portions C in the path of the radiation beam B at a focused and aligned position. Similarly, the first positioner PM and possibly another position sensor (which is not explicitly depicted in FIG. 1) may be used to accurately position the patterning device MA with respect to the path of the radiation beam B. Patterning device MA and substrate W may be aligned using mask alignment marks M1, M2 and substrate alignment marks P1, P2. Although the substrate alignment marks P1, P2 as illustrated occupy dedicated target portions, they may be located in spaces between target portions. Substrate alignment marks P1, P2 are known as scribe-lane alignment marks when these are located between the target portions C.

To clarify the invention, a Cartesian coordinate system is used. The Cartesian coordinate system has three axis, i.e., an x-axis, a y-axis and a z-axis. Each of the three axis is orthogonal to the other two axis. A rotation around the x-axis is referred to as an Rx-rotation. A rotation around the y-axis is referred to as an Ry-rotation. A rotation around about the z-axis is referred to as an Rz-rotation. The x-axis and the y-axis define a horizontal plane, whereas the z-axis is in a vertical direction. The Cartesian coordinate system is not limiting the invention and is used for clarification only. Instead, another coordinate system, such as a cylindrical coordinate system, may be used to clarify the invention. The orientation of the Cartesian coordinate system may be different, for example, such that the z-axis has a component along the horizontal plane.

In the manufacture of complex devices, typically many lithographic patterning steps are performed, thereby forming functional features in successive layers on the substrate. A critical aspect of performance of the lithographic apparatus is therefore the ability to place the applied pattern correctly and accurately in relation to features laid down in previous layers (by the same apparatus or a different lithographic apparatus). For this purpose, the substrate is provided with one or more sets of marks. Each mark is a structure whose position can be measured at a later time using a position sensor, typically an optical position sensor. The position sensor may be referred to as "alignment sensor" and marks may be referred to as "alignment marks".

A lithographic apparatus may include one or more (e.g. a plurality of) alignment sensors by which positions of alignment marks provided on a substrate can be measured accurately. Alignment (or position) sensors may use optical phenomena such as diffraction and interference to obtain position information from alignment marks formed on the substrate. An example of an alignment sensor used in current lithographic apparatus is based on a self-referencing interferometer as described in U.S. Pat. No. 6,961,116. Various enhancements and modifications of the position sensor have been developed, for example as disclosed in US2015261097A1. The contents of all of these publications are incorporated herein by reference.

Figure 2:
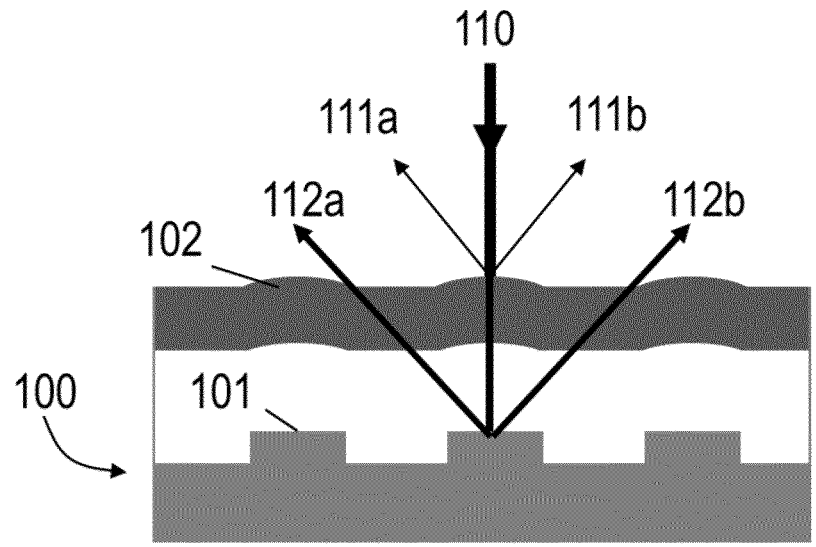
FIG. 2 illustrates the problem.

FIG. 2 illustrates the problem as addressed by the inventors. A substrate 100 provided with a mark 101, for example a periodic grating structure used for alignment and/or metrology purposes, comprises a material layer stack that includes a material layer that is not transparent for visible light. To penetrate the opaque material layer, radiation within the infrared spectrum may be used. For example, the infrared spectrum may cover the near-infrared spectrum measuring form 750 nm to 1300 nm as well as the mid-infrared spectrum covering wavelengths from 1300 nm to 3000 nm. Which part of the spectrum is used may depend on the material properties of the material layer stack. Measurement radiation 110 impinges on the substrate 100 provided with the buried mark 101. A first part of the measurement radiation may be scattered at the substrate surface 102 by surface roughness and/or by the surface topography, for example induced by a residual topography of underlying structures (e.g., the mark), and herewith creating scattered radiation beam 111a and 111b. A second part of the incoming measurement radiation beam may penetrate the substrate and may be diffracted by the buried mark 101 and herewith creating diffraction radiation beam 112a and 112b. For clarity, only one positive diffraction order and one negative diffraction order are illustrated. The total returned radiation may therefore comprise measurement radiation that has interacted with the substrate surface (111a,b) as well as measurement radiation that has interacted with the mark (112a,b), which may carry characteristics of the mark. A measurement result based on the total returned radiation may be erroneous, for example an incorrect mark position.

Figure 3:
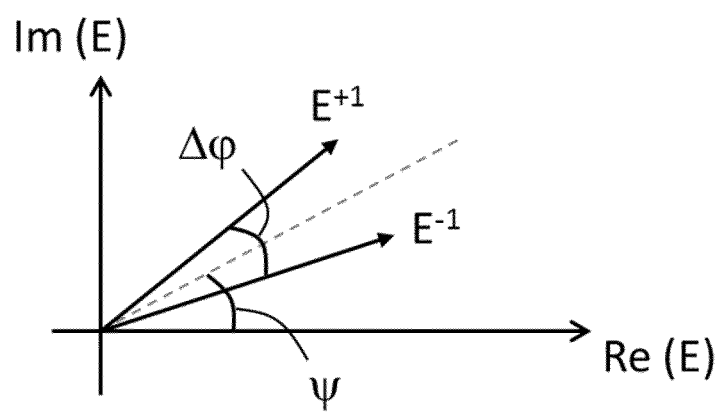
FIG. 3 depicts a complex plane representation of the diffracted radiation fields.

To clarify how scattering of the measurement radiation 110 at the substrate surface 102, due to the residual topography and surface roughness, affects the determination of the mark position, the underlying physics is illustrated by a complex plane representation as depicted in FIG. 3. In this so-called phasor model the electric field component of each returning radiation beam (111a, b and 112a, b) is represented by its real and imaginary parts. In FIG. 3, only the electric field components of the two main conjugate diffraction orders are shown. These may, for example, be the electric field components $E^{-1}$ and $E^{+1}$ of the −1 and +1 diffraction order, respectively. These are typically the resultant of radiation diffraction by a feature comprising a periodic grating structure, for example an alignment or a metrology mark. Referring to FIG. 2, these diffraction orders are the diffracted radiation beams 112a and 112b, respectively.

The position of a mark $x_{mark}$ with respect to a reference position can be described as $x_{mark} = \Delta \varphi P/4\pi$, with $\Delta \varphi$ representing a phase difference between two conjugate diffraction orders and P representing a grating pitch of the mark. In case the mark 101 is displaced with respect to the impinging radiation 110, the phase of the first diffraction order increases and the phase of the second diffraction order decreases. This means that the phase difference $\Delta \varphi$ between the conjugated diffraction orders changes. On the other hand, when the radiation wavelength or the grating pitch is changed, the diffraction orders acquire the same phase increase or decrease and therefore their common phase offset $\psi$ is changed.

The aforementioned phasor model can be applied to a first part of the measurement radiation that returns 111a and 111b after interaction with the substrate surface 102 and to a second part of the radiation 112a and 112b that returns after interaction with the buried mark 101. The radiation received by a detector, for example an alignment or a metrology sensor, may be a combination of the first and the second part of the returned radiation. This will give a combined representation within the phasor model, as is illustrated by FIG. 4.

Figure 4:
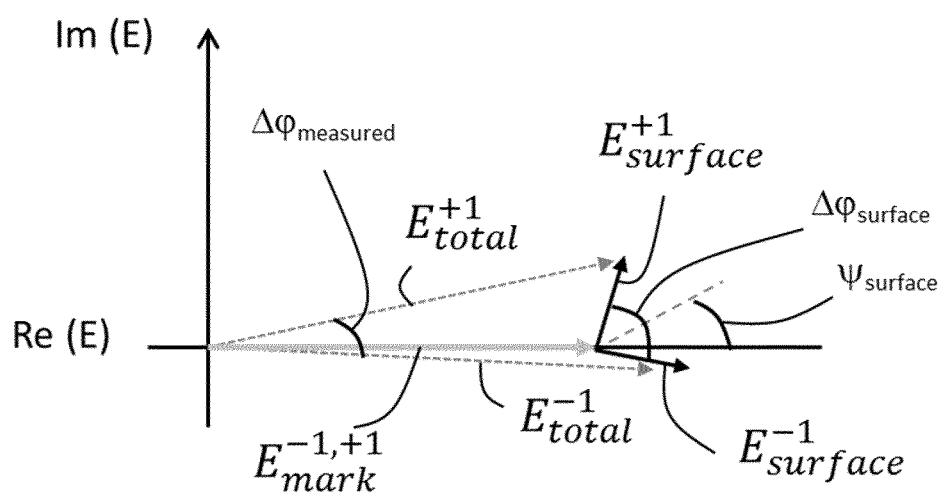
FIG. 4 depicts a complex plane representation of the total diffracted radiation fields.

FIG. 4 depicts a complex plane representation of the total returned radiation after interaction with the substrate 100. In this illustration, we have positioned the impinging radiation beam 110 and the buried mark 101 such that the phase of both diffraction orders $E_{mark}^{-1,+1}$ is zero, and hereby $\Delta \varphi_{mark} = 0$ and $x_{mark} = 0$. For reasons of clarity, the common phase offset is set equal to zero ($\psi_{mark} = 0$). This means that the imaginary part $Im(E_{mark}^{-1,+1})$ is zero. Within the phasor model representation, the measured electric fields $E_{total}^{-1,+1}$ and the measured phase difference $\Delta \varphi_{measured}$ are determined by the electric field components of the radiation $E_{surface}^{-1,+1}$ after interaction with the substrate surface. This means that the measured mark position $x_{measured}$ differs from the actual mark position $x_{mark}$ and moreover the position error is determined by the radiation scattered at the substrate surface. The position error may be described as $x_{measured} - x_{mark} = \Delta \varphi_{measured} P/4\pi$, which is a function of a ratio between the surface scattering signal $E_{surface}$ and the mark signal $E_{mark}$. And since the position error is governed by the phase difference between the scattered fields, the position error depends also on the wavelength of the radiation and the material stack thickness.

For small residual surface topography, whereby $|E_{surface}| < |E_{mark}|$, the position error may be described by $$\text{Position error} \sim \frac{|E_{surface}|}{|E_{mark}|} \cos(\Psi_{surface}(\lambda))[x_{surface} - x_{mark}].$$

The common phase offset $\psi_{surface}$ scales approximately linearly with the radiation wavelength. This means that the position error induced by the surface topography will follow a swing-curve as a function of the radiation wavelength.

Figure 5:
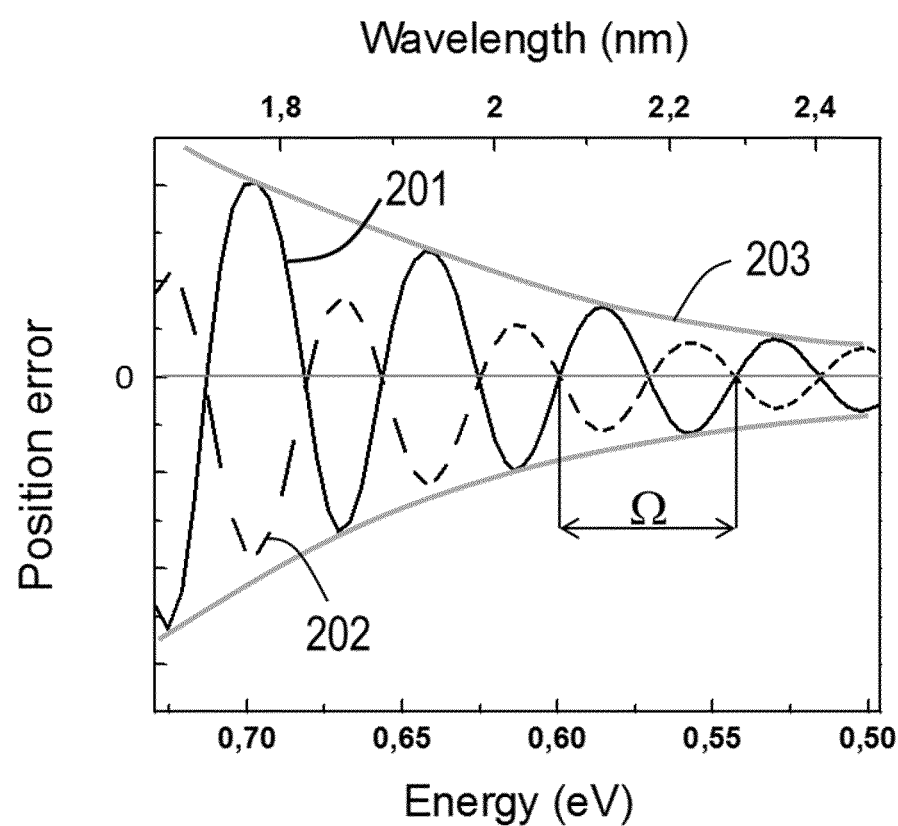
FIG. 5 depicts an illustration of two position error swing curves.

FIG. 5 depicts a graphical representation of the measured position error of a mark as a function of the measurement radiation photon energy and wavelength for a first and a second surface with different topography or roughness. The position error due to the first and second surface may be described by a first swing-curve 201 and second swing-curve 202, respectively, both oscillating around zero. The swing-curves 201, 202 have a periodicity $\Omega$ that is determined by the material stack. The properties of the material stack, for example material thickness and refractive index, determine the propagation time of the measurement radiation 110 within the stack. This means that the characteristics of the swing-curve, for example position of peaks and valleys as well as its period $\Omega$, are stack specific. Consequently, when positions of two marks are measured by using the same radiation wavelength, and each mark is buried by a (slightly) different material stack, the resulting position error of each measurement may differ.

In addition, two substrates with comparable material stacks, but with different surface roughness and/or topology, may have two different swing-curves 201, 202. The amplitude of each swing-curve as well as the sign of the swing curve depend on the surface characteristics. Thus due to a difference in surface characteristics different swing-curves may be obtained for equal of comparable material stacks.

For completeness, the amplitude of the swing-curves 201 and 202 decreases non-linearly, for example exponentially, for increasing wavelength (decreasing energy). This nonlinear behaviour may, for example, be observed for material stacks with an amorphous carbon layer of which the transmission increases as a function of radiation wavelength. This nonlinear trend can be represented by an envelope function 203.

Although semiconductor processes are optimized to have as less as possible intra- and inter-wafer variations, the actual stack properties may vary over a single wafer and between different wafers. This variation can either be in stack thickness or in the stack material composition, both of which will lead to a change or shift of the swing-curve. As will be recognized by the skilled person, and hereby referring to FIG. 5, performing a measurement by using measurement radiation 110 of a wavelength at an inflexion point the result will become sensitive to perturbations. For example, selecting a radiation wavelength at an inflexion point of the swing-curve 201 may result in a position measurement with negligible position error for a first mark at a first location, but for a second mark at a second location with a (slightly) different stack the error may be significant larger.

By using measurement radiation comprising, for example, a first and a second radiation wavelength that differ by half a swing-curve period (both illustrated by 110 in FIG. 2) to measure the position information of a mark 101 provided on a substrate 100, a first and a second position may be obtained. The position information of the mark may be obtained by calculating an average or a weighted sum of the first and second positions. First and second positions may have a first and a second position error, respectively. And since the first and second radiation wavelengths differ by half a swing-curve period ($\Omega/2$), the obtained position errors have opposite signs, i.e., different polarity. By taking into account the nonlinear behaviour of the envelope function 203 when calculating the average or sum weighted position, the position errors cancel each other.

Since the swing-curve is a periodic curve, it will be appreciated by the skilled person to note that the position error cancelation may be achieved by using measurement radiation 110 comprising, for example, two radiation wavelengths that differ an odd integer number of half a swing-curve period: $\Omega/2, 3\Omega/2, 5\Omega/2, \ldots$ etcetera. This series of spectral difference can be written as $(2m+1)\Omega/2$, where m is an integer equal to or greater than 0.

Measurement radiation 110 comprising a first and a second radiation wavelength that differ by an odd number of half a swing-curve period ($\Omega/2$) forms a spectral pair.

In addition, the inventors have recognized that the cancelation principle based on the difference in polarity, as is mentioned above, may be obtained with measurement radiation 110 that has a spectral range limited to a single swing-curve period $\Omega$. By selecting an odd number of different radiation wavelengths, which are equally distributed over a single swing-curve period $\Omega$, the position errors cancel each other by the averaged or sum weighted position. The selected odd number of radiation wavelengths differ by the swing curve period $\Omega$ divided by the odd number of wavelengths: $\Omega/n$, where n is an odd integer greater that 1.

For selecting the at least two radiation wavelengths, a selection criterium based on the position error swing-curve model may be used. Whereby, preferably, the radiation wavelengths are selected by calculation an expected position error such that the summed position errors cancel each other: $\Sigma_i^l p_i \cong 0$ where $p_i$ is the position error at radiation wavelength $\lambda_i$, i an integer, and l the number of wavelengths.

It should be noted that radiation typically has a non-negligible spectral broadening. This means that, although a specific wavelength may be selected, in reality it covers a wavelength range (typically a few nanometers, for example 2 to 10 nanometers full-width-at-half-maximum) with the selected wavelength as the central or reference wavelength.

FIG. 5 depicts two illustrative swing-curves 201 and 202 within the infrared spectrum. It should be noted that the presented spectral range is not limiting the application window. That is, depending on the characteristics of the material stack, a skilled person may choose to apply radiation of higher energy (a wavelength shorter than 1.7 micrometer) or lower energy (a wavelength longer than 2.5 micrometer). In addition, when the material stack is sufficiently transparent, the spectral range wherein in the swing-curves and the wavelength selection apply can cover the visible and/or UV-spectrum.

Figure 6:
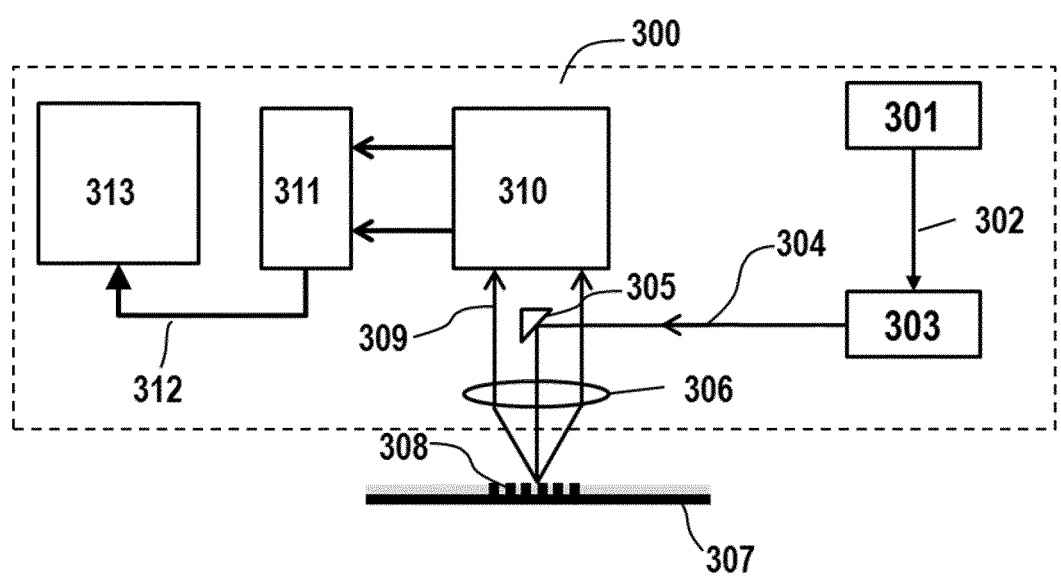
FIG. 6 depicts schematically a position sensor according to an embodiment of the invention.

An embodiment of a position sensor 300 is illustrated in FIG. 6. A wavelength selection system 301 provides a signal 302 to a radiation source 303, whereby at least a first radiation within a first wavelength range and a second radiation within a second wavelength range are selected according to an aspect of the invention. Radiation source 303 may comprise one or more light sources, arranged to generate radiation of at least the selected wavelength ranges, and is configured to provide radiation beam 304. Radiation beam 304 can be directed by an first optical element 305, for example a mirror or a beam splitter, towards a focusing element 306, for example a lens assembly or an objective. Radiation beam 304 is directed via focussing element 306 towards a substrate 307 provided with a target 308. Target 308 may be a mark, for example a periodic grating structure used for alignment and/or metrology purposes, or a patterned structure to obtain the same. At least a part of the radiation is received by the focussing element 306 after interaction with the substrate. This includes radiation that may have interacted with the mark 308, for example diffracted radiation, and or radiation that is diffracted or scattered at the substrate surface. Both are referred as the diffracted radiation for clarity. The diffracted radiation 309 is directed via a second optical element 310 towards one or more optical detectors 311, for example light sensitive detectors such as photodiodes and/or CCD or CMOS image sensors. An output signal 312 carrying characteristic information of the mark 308, or generally speaking the target, is provided to a processor 313 for further processing and analysis in order to derive at least one position-sensitive signal. The position-sensitive signal may be used for control of an apparatus comprising the sensor 300, for example a lithographic system or a metrology system.

The radiation source 303 comprises one or more light sources each with a constant wavelength or comprises one or more light sources of variable wavelength, for example a supercontinuum light source with a tuneable optical filter. In addition, the radiation source 303 may comprise at least one dual-band wavelength selector, for example an optical resonator cascaded with a tuneable bandpass filter, herewith providing radiation of at least two wavelength ranges simultaneously.

Second optical element 310 may comprise an arrangement of lenses and/or minors to direct the diffracted radiation 309 towards the optical detector 311.

Second optical element 310 may comprise one or more dichroic minors or an optical de-multiplexer may be provided to discriminate between different radiation wavelengths. Herewith, the diffracted radiation 309 is filtered before being received by the optical detector 311.

The radiation source 303 may provide radiation of one or more polarizations.

Second optical element 310 may comprise one or more polarizing elements, for example waveplates or retardation plates, to change the polarization of the diffracted radiation 309, or one or more polarizing beam splitters to discriminate between different polarizations.

Furthermore, radiation source 303 may comprise one or more light sources, wherein each light source may operate in a continuous wave mode or in a pulsed mode. Each of the pulsed light sources may be controlled in such a way that each of the pulsed light sources is out of phase with each other pulsed light source. In this way, the radiation source 303 may produce a plurality of pulses, wherein the pulses cycle through a plurality of different wavelengths. In other words, the at least first and second wavelengths are separated temporally. Instead of controlling the light sources directly, the radiation source 303 may comprise a controller to switch between the different wavelengths to obtain the same.

In a specific embodiment, the pulse frequency may be greater than 50 kHz, and more specifically in the region of 100 kHz.

There are a number of advantages in temporally separating different radiation wavelengths for a position sensor. This concept allows more wavelengths to be used in a single measurement and therefore increases the probability that some of the wavelengths are at, or sufficiently near, an intensity peak of the swing-curve. Although a position error may be relatively large at a wavelength corresponding to a peak or a valley of the swing curve 201, 202, the position error is less sensitive to material stack variations and surface roughness variations with respect to the wavelength-sensitivity of a position error at a zero-crossing of the swing curve. By calculating the average or the weighted sum of the positions obtained by using radiation wavelengths at these robust swing curve positions, the chance of an erroneous position measurement is reduced.

Optical detector 311 may be a time-gated optical detector synchronized to a pulsed radiation source 303 in order to discriminate between the plurality of wavelengths in the time domain.

In an embodiment the position sensor 300 comprises an second optical element 310 provided with at least one interferometer, for example a self-referencing interferometer as described in U.S. Pat. No. 6,961,116.

In an embodiment the position sensor 300 may be a field image sensor arranged to determine the position of one or more marks on a substrate 307.

One or more position sensors may be arranged within an alignment system.

In an embodiment a position dependent measurement of one or more targets 308 is executed (scanning of the target) by controlling the position of the substrate 307 relatively to the position sensor 300, for example via a position controller. The properties of the radiation 309 received by the optical detector 311 are dependent on the local interaction of the radiation 304 with the target 308. In an embodiment an one-dimensional or a higher dimensional image of one or more targets, for example alignment or metrology marks, is generated by combining information obtained by the position sensor 300, which is processed and sent as output by the processor 313, with information of the position of the one or more targets 308. It should be understood that further processing of the obtained images, which typically involves a computer assembly, may be used to obtain target position information for alignment purposes within, for example, a lithographic apparatus LA, or may be used to obtain target characteristics in a metrology system to characterize a substrate or to acquire overlay data between multiple layers provided on a substrate.

A lithographic apparatus LA comprising at least one position sensor 300 according to the invention may be applied as an alignment sensor to acquire position information of one or more buried alignment marks on a substrate. The lithographic apparatus LA may comprise a controller configured for causing the at least one position sensor 300 to acquire the position information of one or more marks. For example by controlling a position of a substrate support relatively to the position sensor 300, herewith scanning the substrate and mark. Information of the mark positions may be used to calculate a wafer grid map before a next exposure step. In an embodiment the at least one position sensor 300 is, for example, applied as a field image alignment system or as an alignment sensor comprising a self-referencing interferometer.

A metrology apparatus comprising at least one position sensor 300 according to the invention may be applied to acquire the position information of one or more metrology marks that are buried by material layers that are opaque for radiation within the visible spectrum, in order to obtain overlay information of the layers. The metrology apparatus may comprise a controller configured for causing the at least one position sensor 300 to acquire the position information of one or more marks. For example by controlling a position of a substrate support relatively to the position sensor 300, herewith scanning the substrate and mark. In addition, the mark position information may be used to generate a wafer grid map. This wafer grid map may be used in a lithographic apparatus LA for a next exposure step as a feedforward control, whether in combination with a wafer grid map based on an alignment sequence in the lithographic apparatus or not.

In an embodiment, a system comprises a lithographic apparatus LA and a metrology apparatus. The system includes at least one position sensor according to the invention. Herewith, either the lithographic apparatus LA or the metrology apparatus or both the lithographic apparatus LA and the metrology apparatus are capable of acquiring position information of one or more marks that are buried by opaque material layers.

In case, for example, both the lithographic apparatus LA and the metrology apparatus comprise at least one position sensor 300 according to the invention, either as a combined system or as separated apparatuses, the position information of the same mark or the same set of marks may be acquired with both apparatuses. Further more, a mark set formed by a plurality of marks may be divided in at least a first mark set and a second mark set. Position information of the marks forming the first mark set are acquired by the position sensor of the metrology apparatus, and the position information of the marks forming the second mark set are acquired by the lithographic apparatus LA. A first and a second wafer grid map may be generated, comprising the position information of the first and second mark set, respectively. First and second mark sets may comprise one or more the same marks. The position information of these marks may be used to correlate and or to calibrate the first wafer grid map with the second wafer grid map.

Figure 7:
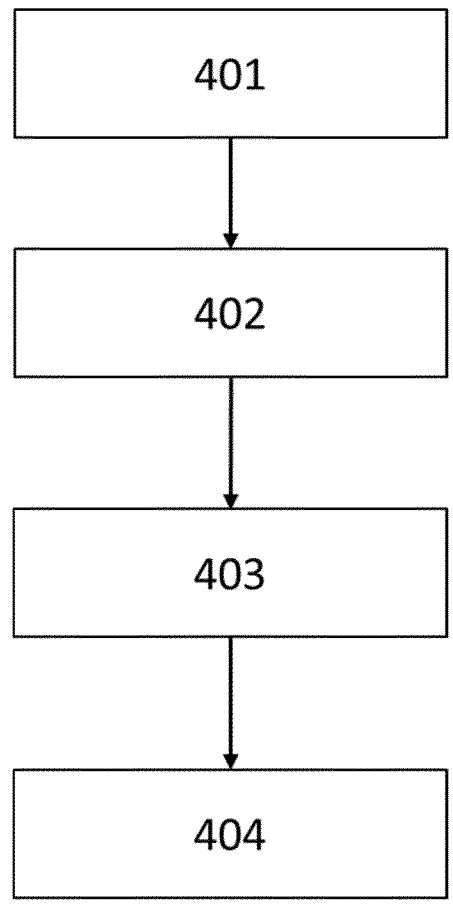
FIG. 7 depicts a flow diagram in accordance with the invention.

FIG. 7 depicts a flow diagram showing a method to define, select, and to set the radiation spectral (or wavelength) ranges based on one or more swing-curve models, for example based on the position error swing-curves 201 and 202 as shown in FIG. 5. The radiation with selected spectral ranges can be used with the position sensor 300, as illustrated in FIG. 6. A wavelength selection system 301 may have access to one or more subsystems. For example, a first subsystem is configured to receive information of the material layer stack, as is illustrated by step 401, and is configured to calculate a position swing-curve model comprising one or more swing-curves 402. It will be appreciated by the skilled person, that the swing-curve model may also be acquired empirically by recording the measured position as a function of measurement wavelength. A second subsystem is configured to select, based on the swing-curve model, at least two wavelength ranges that form at least one spectral pair 403. As a criterium, the radiation wavelengths may be selected by calculation an expected position error based on the swing-curve model according $E_i{}^n p_i \cong 0$, where $p_i$ is the position error at radiation wavelength $\lambda_i$, i an integer, and n the number of wavelengths. For example, a spectral pair may be formed by a first and a second wavelength range that differ by half a swing-curve period $\Omega/2$. In case of a broad wavelength range, the central wavelength within this range is used as a reference wavelength. Information of the spectral selection is provided to the radiation source at step 404, for example via signal 302, wherein the wavelength of the radiation provided by the radiation source 303 is set according to the at least one spectral pair.

Using more than one position error swing-curve for the wavelength range selection may be beneficial to anticipate on topology and roughness variation over a single substrate 102 or between multiple substrates. This means that, for example, more than two wavelengths ranges or a plurality of spectral pairs are selected.

It will be appreciated by the skilled person that a first, a second, and a third wavelength range may be selected in such a way that each of three wavelength ranges differ by half a swing-curve with each other wavelength range. These three wavelength ranges can be used to form two spectral pairs: a first spectral pair formed by the first and the second wavelength ranges and a second spectral pair formed by the second and the third wavelength ranges. Such a setting can be used to become less sensitive to substrate surface and stack variations as well as to be less reliant on the individual wavelength ranges.

According to the invention, a measurement series comprising at least a first measurement and a second measurement, wherein the first and second measurements are not performed at the same moment (temporally separated), may be used to determine a position of a target, e.g., a mark provided on a substrate, using position sensor 300. The first measurement is performed by providing measurement radiation with at least a first spectral radiation set, for example a first spectral pair, herewith providing a first position of the target. The second measurement is performed by providing measurement radiation with at least a second spectral radiation set, for example a second spectral pair, herewith providing a second position of the target. The first spectral radiation set and the second spectral radiation set may be based on a first swing-curve and a second swing-curve, respectively. A weighted position of the target is determined by a weighted summation of the first position with a first weight and the second position with a second weight. The first weights and the second weight may have opposite signs. That is, first and second weights may be opposite weights.

The first and second swing-curve may differ or may be the same.

Both the first radiation set and the second radiation set may comprise two or more wavelengths each.

The measurement radiation after interaction with the target (e.g., mark) may detected by at least one optical detector. It may be advantageous to perform the measurement with one optical detector. Herewith, multiple colours (i.e., measurement radiation with different wavelength) may be balanced at the one detector. That is, a first position derived from a first measurement using a first radiation with a first wavelength may result in a first position error, and a second position derived from a second measurement using a second radiation with a second wavelength may result in a second position error, which may have an opposite sign to the first position error. Detecting first and second radiation at the one detector (both at the same detector) and at the same moment in time, may result in a balancing or cancelling out first and second position errors.

A plurality of position sensors 300 may have a common radiation source. For example, a single radiation source 303 may be configured to provide measurement radiation 304 to multiple position sensors 300. It may be beneficial to provide measurement radiation comprising one spectral pair to the different position sensors 300 in case the material stack is uniform over the wafer. In cases when the material stack is not uniform, the skilled person may choose to use multiple spectral pairs that distributed over the plurality of position sensors 300. In such a case, two or more (for example five) position sensors 300 may provide different radiation spectrums to the substrate 307.

Although specific reference may be made in this text to the use of a lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

Although specific reference may be made in this text to embodiments of the invention in the context of a lithographic apparatus, embodiments of the invention may be used in other apparatus. Embodiments of the invention may form part of a mask inspection apparatus, a metrology apparatus, or any apparatus that measures or processes an object such as a wafer (or other substrate) or mask (or other patterning device). These apparatus may be generally referred to as lithographic tools. Such a lithographic tool may use vacuum conditions or ambient (non-vacuum) conditions.

Although specific reference may have been made above to the use of embodiments of the invention in the context of optical lithography, it will be appreciated that the invention, where the context allows, is not limited to optical lithography and may be used in other applications, for example imprint lithography.

Where the context allows, embodiments of the invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic storage media; optical storage media; flash memory devices; electrical, optical, acoustical or other forms of propagated signals (e.g. carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc. and in doing that may cause actuators or other devices to interact with the physical world.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below. Other aspects of the invention are set out as in the following numbered clauses:

1. A position sensor comprising:
an optical system configured to provide measurement radiation to a substrate and to receive at least part of diffracted radiation after the measurement radiation has interacted with a mark provided on the substrate, wherein the measurement radiation comprises at least two selected radiation wavelengths, at least one optical detector configured to detect the at least part of diffracted radiation and arranged to convert the detected at least part of diffracted radiation to an electronic signal, a processor configured to derive at least one position-sensitive signal from the electronic signal, and a radiation wavelength selection system having access to at least one of a first subsystem and a second subsystem;
the first subsystem configured to receive material stack information and to calculate a position error swing-curve model, the second subsystem configured to select the at least two selected radiation wavelengths based on the position error swing-curve model.
2. The position sensor according clause 1, wherein the at least two selected radiation wavelengths have position errors with opposite polarity.
3. The position sensor according to clause 1, wherein the at least two selected wavelengths differ by $(2m+1)\Omega/2$, where m is an integer equal to or greater than 0 and $\Omega$ a swing-curve period.
4. The position sensor according to clause 1, wherein the measurement radiation comprises n wavelengths and the n radiation wavelengths differ by $\Omega/n$, where n is an odd integer greater than 1, and $\Omega$ a swing-curve period.
5. The position sensor according to any one of clauses 1 to 4, wherein the optical system comprises an optical transmission filter with a suppression spectrum according to an envelope of the swing-curve model.
6. The position sensor according to any one of clauses 1 to 5, wherein the measurement radiation is provided by a radiation source comprising one or more light sources are arranged to generate radiation of the at least two selected radiation wavelengths.
7. The position sensor according to any one of clauses 1 to 5, wherein the measurement radiation is provided by a radiation source, comprising at least one dual-band wavelength selector.
8. The position sensor according to clause 6 or 7, wherein the radiation source is configured to operate in a pulsed mode, herewith generating the measurement radiation having temporally separated the at least first and second radiation wavelengths.
9. The position sensor according clause 8 comprising a time-gated optical detector synchronized to the radiation source.
10. The position sensor according to any one of clauses 1 to 9, wherein the optical system comprises at least one interferometer.
11. A lithographic apparatus arranged to apply a pattern to a substrate, the lithographic apparatus comprising at least one position sensor as claimed in any one of clauses 1 to 10 and a controller configured for causing the at least one position sensor to acquire the position information of one or more marks using the measurement radiation with at least a first and a second radiation wavelength, and for using the measured position of the marks to control the positioning of the substrate.
12. A metrology apparatus comprising at least one position sensor according any one of clauses 1 to 10 and a controller configured for causing the at least one position sensor to acquire the position information of one or more marks using the measurement radiation with at least a first and a second radiation wavelength.
13. The metrology apparatus according clause 12 arranged to provide a wafer grid map to a lithographic apparatus, wherein the provided wafer grid map is in accordance with the acquired position information of one or more marks.
14. A system comprising a metrology apparatus and the lithographic apparatus according clause 11.
15. A system comprising a lithographic apparatus and the metrology apparatus according clause 12 or clause 13.
16. A system comprising the lithographic apparatus according clause 11 and the metrology apparatus according clause 12 or 13.
17. A method for obtaining position information of a mark provided on an object, the method comprising the steps of:
selecting at least a first radiation wavelength and a second radiation wavelength,
irradiating the object with measurement radiation of at least the first and second radiation wavelength,
receiving at least a portion of the radiation diffracted and/or scattered from the object,
generating a position measurement signal from a detector output signal,
deriving characteristics of the mark from the position measurement signal,
whereby the selection of the at least first and second radiation wavelengths is based on a position error swing-curve model.

The invention claimed is:
1. A position sensor comprising:
an optical system configured to provide measurement radiation to a substrate and to receive at least part of diffracted radiation after the measurement radiation has interacted with a mark provided on the substrate, wherein the measurement radiation comprises at least two selected radiation wavelengths,
at least one optical detector configured to detect the at least part of diffracted radiation and arranged to convert the detected at least part of diffracted radiation to an electronic signal,
a processor configured to derive at least one mark position-sensitive signal from the electronic signal, and
a radiation wavelength selection system;
configured to receive material stack information about the substrate and
to select the at least two selected radiation wavelengths based on a mark position error swing-curve model.
2. The position sensor according to claim 1, wherein the at least two selected wavelengths differ by $(2m+1)\Omega/2$, where m is an integer equal to or greater than 0 and $\Omega$ a swing-curve period.
3. The position sensor according to claim 1, wherein measurement radiation comprises n wavelengths and the n radiation wavelengths differ by $\Omega/n$, where n is an odd integer greater than 1, and $\Omega$ a swing-curve period.
4. The position sensor according to claim 1, wherein the measurement radiation is provided by a radiation source comprising one or more light sources that are arranged to generate radiation of the at least two selected radiation wavelengths.

5. The position sensor according to claim 4, wherein the radiation source is configured to operate in a pulsed mode, herewith generating the measurement radiation having temporally separated the at least two selected radiation wavelengths.

6. The position sensor according to claim 5, further comprising a time-gated optical detector synchronized to the radiation source.

7. The position sensor according to claim 1, wherein the measurement radiation is provided by a radiation source comprising at least one dual-band wavelength selector.

8. The position sensor according to claim 7, wherein the radiation source is configured to operate in a pulsed mode, herewith generating the measurement radiation having temporally separated the two selected radiation wavelengths.

9. The position sensor according to claim 1, wherein the optical system comprises at least one interferometer.

10. A lithographic apparatus arranged to apply a pattern to a substrate, the lithographic apparatus comprising at least one position sensor as claimed in claim 1 and a controller configured for causing the at least one position sensor to acquire the position information of one or more marks using the measurement radiation with at least a first and a second radiation wavelength, and for using the measured position of the marks to control the positioning of the substrate.

11. A system comprising a metrology apparatus and the lithographic apparatus according to claim 10.

12. A metrology apparatus comprising at least one position sensor as claimed in claim 1 and a controller configured for causing the at least one position sensor to acquire the position information of one or more marks using the measurement radiation with at least a first and a second radiation wavelength.

13. The metrology apparatus according to claim 12 arranged to provide a wafer grid map to a lithographic apparatus, wherein the provided wafer grid map is in accordance with the acquired position information of one or more marks.

14. A system comprising a lithographic apparatus and the metrology apparatus according to claim 12.

15. A system comprising:
a lithographic apparatus arranged to apply a pattern to a substrate, the lithographic apparatus comprising at least one position sensor as claimed in claim 1, and a controller configured for causing the at least one position sensor to acquire the position information of one or more marks using the measurement radiation with at least a first and a second radiation wavelength, and for using the measured position of the marks to control the positioning of the substrate; and
a metrology apparatus comprising at least one position sensor as claimed in claim 1 and a controller configured for causing the at least one position sensor to acquire the position information of one or more marks using the measurement radiation with at least a first and second radiation wavelength.

16. The position sensor according to claim 1, wherein the optical system comprises a focusing element configured to direct the measurement radiation toward the substrate and to receive at least part of the diffracted radiation.

17. The position sensor according to claim 1, wherein the optical system comprises one or more dichroic mirrors or an optical de-multiplexer configured to discriminate between different radiation wavelengths.

18. The position sensor according to claim 1, wherein the mark position error swing-curve model has a periodicity.

19. A position sensor comprising:
an optical system configured to provide measurement radiation to a substrate and to receive at least part of diffracted radiation after the measurement radiation has interacted with a mark provided on the substrate, wherein the measurement radiation comprises at least two selected radiation wavelengths,
at least one optical detector configured to detect the at least part of diffracted radiation and arranged to convert the detected at least part of diffracted radiation to an electronic signal,
a processor configured to derive at least one position-sensitive signal from the electronic signal, and
a radiation wavelength selection system having access to at least one of a first subsystem and a second subsystem;
the first subsystem configured to receive material stack information and to calculate a position error swing-curve model, and
the second subsystem configured to select the at least two selected radiation wavelengths based on a position error swing-curve model,
wherein the at least two selected radiation wavelengths have position errors with opposite polarity.

20. A position sensor comprising:
an optical system configured to provide measurement radiation to a substrate and to receive at least part of diffracted radiation after the measurement radiation has interacted with a mark provided on the substrate, wherein the measurement radiation comprises at least two selected radiation wavelengths,
at least one optical detector configured to detect the at least part of diffracted radiation and arranged to convert the detected at least part of diffracted radiation to an electronic signal,
a processor configured to derive at least one position-sensitive signal from the electronic signal, and
a radiation wavelength selection system having access to at least one of a first subsystem and a second subsystem;
the first subsystem configured to receive material stack information and to calculate a position error swing-curve model, and
the second subsystem configured to select the at least two selected radiation wavelengths based on a position error swing-curve model,
wherein the optical system comprises an optical transmission filter with a suppression spectrum according to an envelope of the swing-curve model.

21. A method for obtaining position information of a mark provided on an object, the method comprising the steps of:
selecting at least a first radiation wavelength and a second radiation wavelength based on a mark position error swing-curve model having a periodicity,
irradiating the object with measurement radiation of at least the first and second radiation wavelength,
receiving at least a portion of the radiation diffracted and/or scattered from the object,
generating a position measurement signal from a detector output signal, and
deriving characteristics of the mark from the position measurement signal.

22. The method according to claim 21, wherein selecting the first radiation wavelength and the second radiation wavelength comprises selecting the first radiation wavelength at an inflexion point of the mark position error swing-curve model and selecting the second radiation wavelength at an inflexion point of the mark position error swing-curve model.

* * * * *